US012733263B2

(12) United States Patent
Wen et al.

(10) Patent No.: US 12,733,263 B2
(45) Date of Patent: Sep. 8, 2026

(54) TWO-DIMENSIONAL POWER CLAMP CELL

(71) Applicant: MEDIATEK INC., Hsin-Chu (TW)

(72) Inventors: Yung-Ju Wen, Hsinchu City (TW); Bo-Shih Huang, Hsinchu City (TW)

(73) Assignee: MEDIATEK INC., Hsinchu City (TW)

(*) Notice: Subject to any disclaimer, the term of this patent is extended or adjusted under 35 U.S.C. 154(b) by 184 days.

(21) Appl. No.: 18/593,962

(22) Filed: Mar. 3, 2024

(65) Prior Publication Data

US 2024/0332286 A1 Oct. 3, 2024

Related U.S. Application Data

(60) Provisional application No. 63/492,493, filed on Mar. 28, 2023.

(51) Int. Cl.
*H10D 89/60* (2025.01)
*G05F 1/569* (2006.01)

(52) U.S. Cl.
CPC ........... *H10D 89/811* (2025.01); *G05F 1/569* (2013.01); *H10D 89/921* (2025.01); *H10D 89/931* (2025.01)

(58) Field of Classification Search
CPC . H01L 27/02; H01L 27/0266; H01L 27/0292; H01L 27/0296; H01L 29/772; G05F 1/569; H10D 89/811; H10D 89/921; H10D 89/931; H10D 89/60; H02H 9/00
USPC .................................................... 361/56, 111
See application file for complete search history.

(56) References Cited

U.S. PATENT DOCUMENTS 6,104,588 A 8/2000 Hariton et al.
7,593,202 B2 9/2009 Khazhinsky et al.
9,478,533 B2 10/2016 Ma
10,943,080 B2 3/2021 Suwald
2003/0235019 A1 12/2003 Ker
2010/0169845 A1 7/2010 Boselli
2010/0246079 A1* 9/2010 Suzuki ................. H10D 89/819 257/E29.242
2013/0285196 A1 10/2013 Dissegna
2015/0349526 A1* 12/2015 Duby ........................ H02J 1/00 307/11
2021/0384723 A1* 12/2021 Bandaru .............. H10D 89/611
2023/0139094 A1* 5/2023 Morishita ............ H10D 89/601 257/546

FOREIGN PATENT DOCUMENTS

EP 2244292 10/2010

* cited by examiner

*Primary Examiner* — Danny Nguyen
(74) *Attorney, Agent, or Firm* — Winston Hsu

(57) ABSTRACT

The present invention provides a power clamp cell including a power clamping circuit, a power routing and a global routing is disclosed. The power routing has at least a first vertical metal line and a first horizontal metal line, and the power routing is implemented by using a first metal layer in semiconductor process. The ground routing has at least a second vertical metal line and a second horizontal metal line, and the ground routing is implemented by using a second metal layer in the semiconductor process.

5 Claims, 4 Drawing Sheets

Power routing

Ground routing

TWO-DIMENSIONAL POWER CLAMP CELL

CROSS REFERENCE TO RELATED APPLICATIONS

This application claims the benefit of U.S. Provisional Application No. 63/492,493, filed on Mar. 28, 2023. The content of the application is incorporated herein by reference.

BACKGROUND

At the end of the chip layout, if there is any blank area left, one or more decoupling capacitors are usually placed to stabilize a supply voltage of the chip. In addition, the blank area of the chip layout usually has deformed shape, therefore, if electrostatic discharge (ESD) power clamp circuits are to be placed in this deformed blank area, the ESD power clamp circuits will need to be re-designed and planned, causing a burden on the chip design.

SUMMARY

It is therefore an objective of the present invention to provide a two-dimensional (2-D) puzzle power clamp cell that has two directions of metal routing, so that the designer can abut each 2-D puzzle power clamp cell together to fit the shape of the blank area, to solve the above-mentioned problems.

According to one embodiment of the present invention, a power clamp cell comprising a power clamping circuit, a power routing and a global routing is disclosed. The power routing has at least a first vertical metal line and a first horizontal metal line, and the power routing is implemented by using a first metal layer in semiconductor process. The ground routing has at least a second vertical metal line and a second horizontal metal line, and the ground routing is implemented by using a second metal layer in the semiconductor process.

According to one embodiment of the present invention, a power clamp group comprising a plurality of power clamp cells is disclosed. The plurality of power clamp cells comprise at least a first power clamp cell, a second power clamp cell and a third power clamp cell, wherein the plurality of power clamp cells have the same circuit design, the first power clamp cell is immediately connected to the second power clamp cell in a vertical direction, and the first power clamp cell is immediately connected to the third power clamp cell in a horizontal direction.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figures 1, 2:
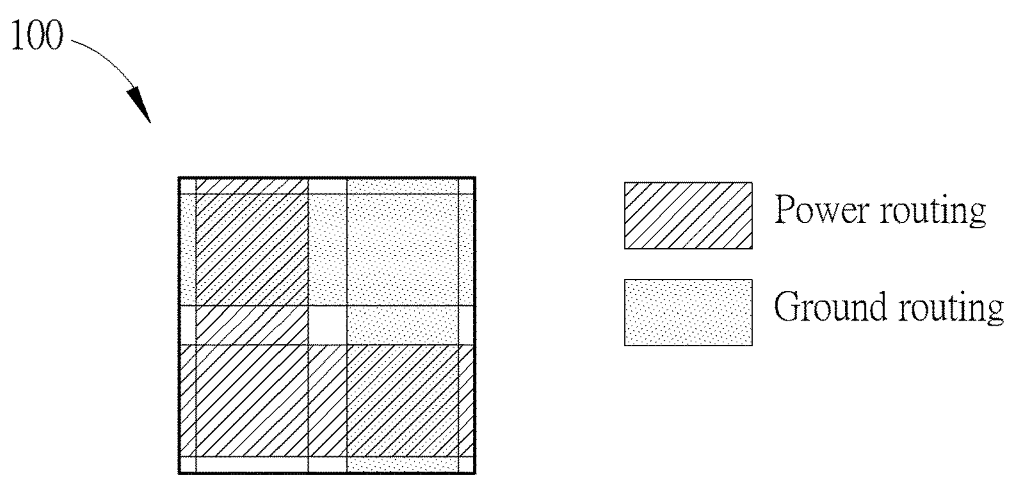
FIG. 1 is a diagram illustrating routings of a power clamp cell according to one embodiment of the present invention.
FIG. 2 is a diagram illustrating a power clamp group comprising a plurality of power clamp cells according to one embodiment of the present invention.

FIG. 1 is a diagram illustrating routings of a power clamp cell 100 according to one embodiment of the present invention. As shown in FIG. 1, the power clamp cell 100 comprises a power routing and a ground routing, wherein the power routing has two directions and the ground routing also has two directions. In this embodiment, the power routing has a vertical metal line and a horizontal metal line, wherein the power routing is implemented by using a first metal layer in the semiconductor process, and the power routing is used to receive a supply voltage such as 0.7V, 1.3V or 1.5V and provide the supply voltage to the semiconductor devices. The ground routing has a vertical metal line and a horizontal metal line, wherein the ground routing is implemented by using a second metal layer in the semiconductor process, the ground routing is used to receive a ground voltage and provide the ground voltage to the semiconductor devices, and there is at least one insulation layer manufactured between the first metal layer and the second metal layer.

Figure 3:
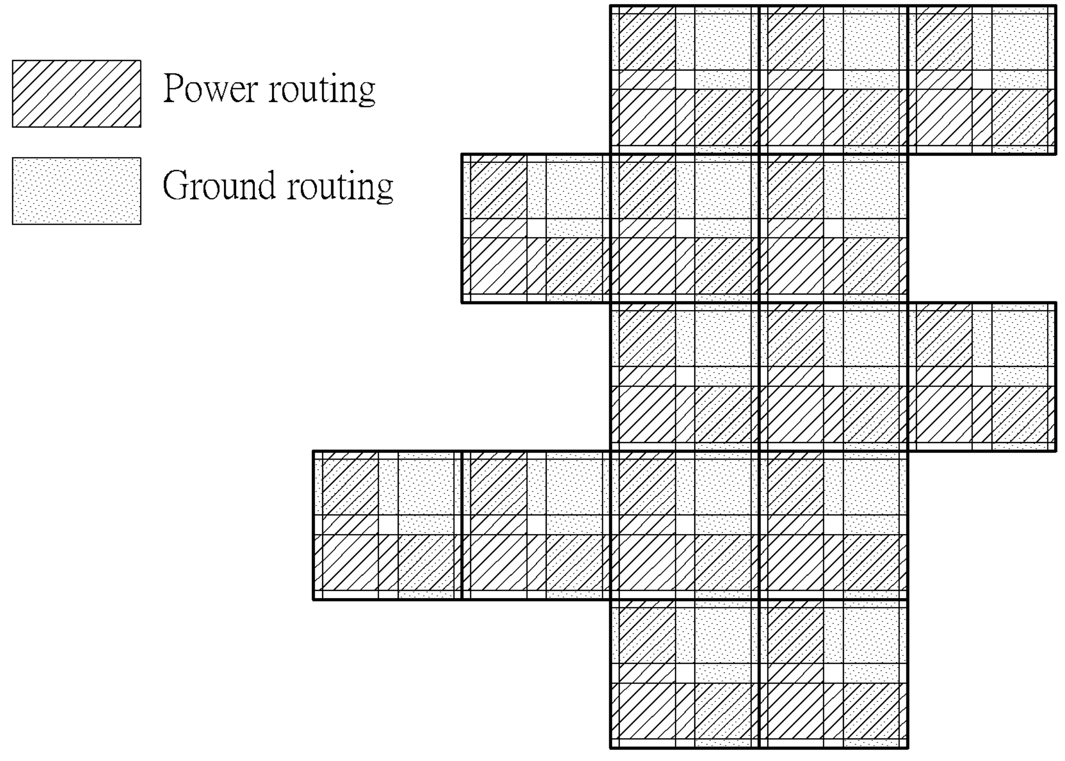
FIG. 3 is a diagram illustrating a power clamp group comprising a plurality of power clamp cells according to one embodiment of the present invention.

In the embodiment shown in FIG. 1, because the power clamp cell 100 comprises metal routings in two directions, so the designer can abut many power clamp cells 100 together by doing puzzles without any restriction to any blank area of the chip layout. Taking FIG. 2 and FIG. 3 as examples, one power clamp cell can be immediately connected to any side of another power clamp cell, and the power routing and the ground routing can automatically connected together without any manual handling procedures. Therefore, the designer can group multiple power clamp cells to generate a power clamp group with any suitable shape, so that the power clamp group fits the shape of the blank area of the chip layer, to add more components to the chip more efficiently.

It is noted that the number of metal lines of the power clamp cell 100 shown in FIG. 1 is for illustrative, not a limitation of the present invention. In other embodiments, the power routing may have two or more vertical metal lines and/or two or more horizontal metal lines, and the ground routing may have two or more vertical metal lines and/or two or more horizontal metal lines. These alternative designs shall fall within the scope of the present invention.

Figure 4:
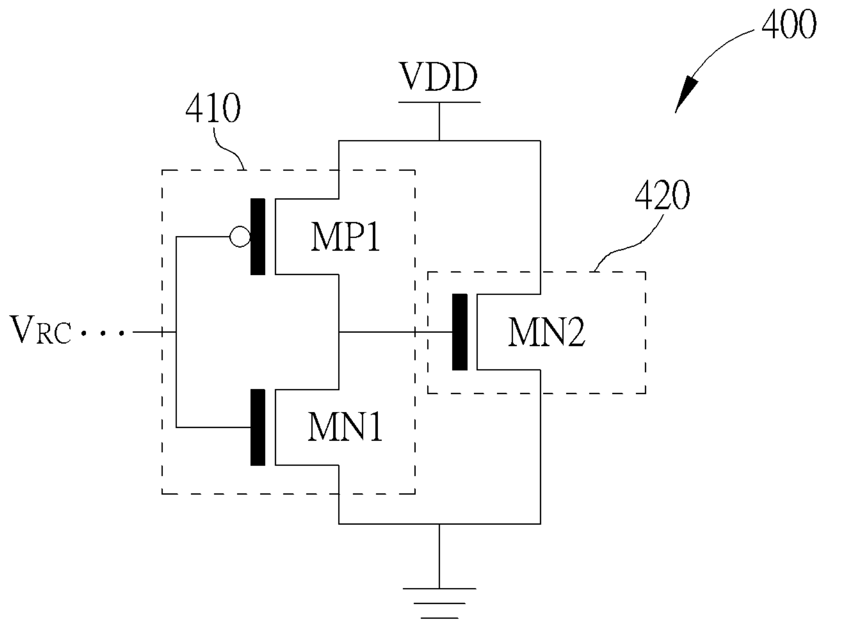
FIG. 4 shows a power clamping circuit.

FIG. 1 merely shows the power routing and the ground routing of the power clamp cell 100, but the power clamp cell 100 also comprises a power clamping circuit 400 as shown in FIG. 4. As shown in FIG. 4, the power clamping circuit 400 comprises a trigger circuit 410 and a clamp device 420. In this embodiment, the trigger device 410 is implemented by using an inverter comprising a P-type Metal Oxide Semiconductor (PMOS) MP1 and an N-type Metal Oxide Semiconductor (NMOS) MN1 coupled between the supply voltage VDD and the ground voltage, and the clamp device 420 is implemented by using an NMOS MN2 coupled between the supply voltage VDD and the ground voltage. In the operation of the power clamping circuit 400, the trigger circuit 410 receives an ESD detection signal $V_{RC}$ to generate a trigger signal to enable or disable the clamp device 420. In this embodiment, the ESD detection signal $V_{RC}$ is generated by an ESD detection circuit (not shown), and the ESD detection signal $V_{RC}$ has a low voltage level when an ESD occurs; and when the ESD occurs, the trigger circuit 410 generates the trigger signal with high voltage according to the ESD detection signal $V_{RC}$, to enable the NMOS MN2 to discharge the current to stabilize the supply voltage VDD. It is noted that the power clamping circuit 400 shown in FIG. 4 is for illustrative, not a limitation of the present invention. As long as the trigger circuit 410 can generate the trigger signal to enable/disable the clamp device 420 according the ESD detection signal $V_{RC}$, the trigger circuit 410 and the clamp device 420 may have different circuit designs, for example, the clamp device can be implemented by grounded-gate NMOS (ggNMOS), field oxide device (FOD), cascode clamp device, silicon controlled rectifier (SCR), Zener diode, bipolar transistor (BJT) or any other suitable device.

Figure 5:
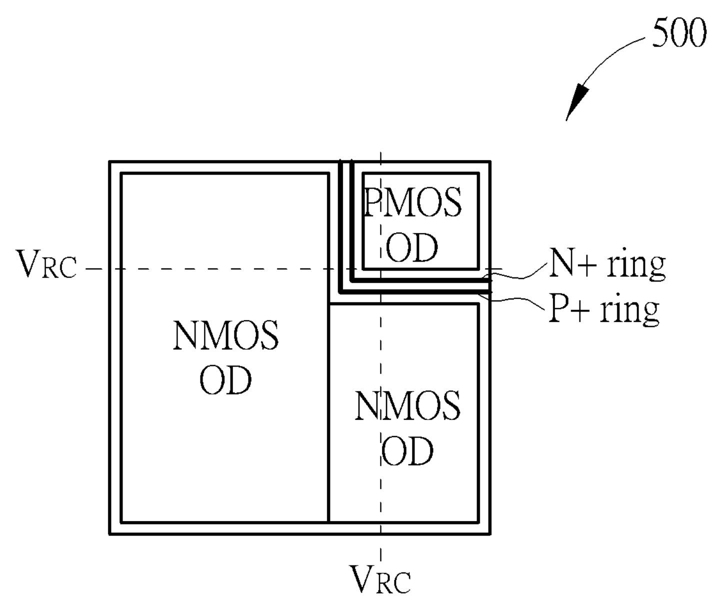
FIG. 5 is a diagram illustrating routings of a power clamp cell according to one embodiment of the present invention.

FIG. 5 is a diagram illustrating a power clamp cell 500 according to one embodiment of the present invention. As shown in FIG. 5, the power clamp cell 500 comprises two NMOS oxide diffusion (OD) and a PMOS OD, wherein the PMOS OD is positioned in a corner, such as an upper-right corner, of the power clamp cell 500, and two NMOS ODs are positioned together and located in the other three corners of the power clamp cell 500. In this embodiment, the area corresponding to the PMOS OD is used to implement the PMOS MP1 shown in FIG. 4, and an N+ ring is manufactured around the PMOS OD; and the area corresponding to the NMOS OD is used to implement the NMOSs MN1 and MN2 shown in FIG. 4, and a P+ ring is manufactured between the NMOS OD and the N+ ring. In addition, the power clamp cell 500 further comprises a global bus comprising a vertical metal line and a horizontal metal line for the transmission of the ESD detection signal $V_{RC}$.

Figure 6:
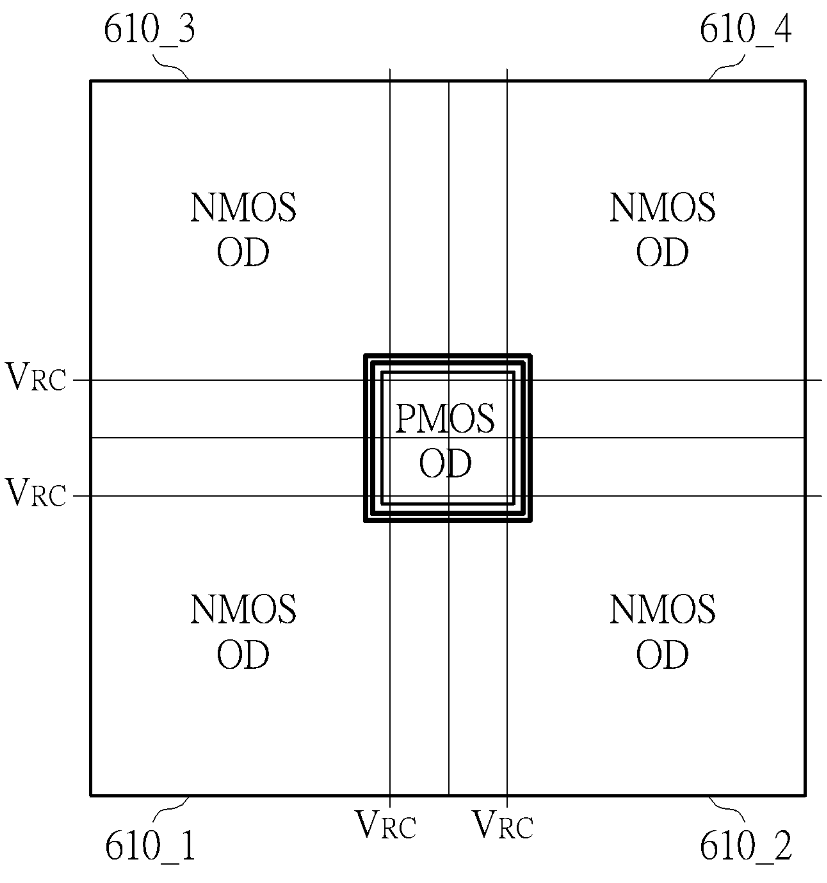
FIG. 6 is a diagram illustrating a power clamp group comprising a plurality of power clamp cells according to one embodiment of the present invention.

In the embodiment shown in FIG. 5, because of the design of the power clamp cell 500, the designer can abut many power clamp cells 500 together by doing puzzles without any restriction to any blank area of the chip layout. Taking FIG. 6 as examples, four power clamp cells 610_1-610_4 can be combined together to form a power clamp group, wherein the PMOSs are located in the middle region of the power clamp group, and the NMOSs are located in the other regions of the power clamp group. Specifically, the power clamp cell 610_1 is the same as the power clamp cell 500 shown in FIG. 5, the power clamp cell 610_2 is a vertical mirror of the power clam cell 500 (i.e., vertical line symmetry) or a result of rotating the power clam cell 500 with 90 degrees counterclockwise, the power clamp cell 610_3 is a horizontal mirror of the power clam cell 500 (i.e., horizontal line symmetry) or a result of rotating the power clam cell 500 with 90 degrees clockwise, and the power clamp cell 610_4 is a result of rotating the power clam cell 500 with 180 degrees clockwise. Therefore, the designer can group multiple power clamp cells to generate the power clamp group with any suitable shape, so that the power clamp group fits the shape of the blank area of the chip layer, to add more components to the chip more efficiently.

In addition, because all the power clamp cells 610_1-610_4 of the power clamp group share the same ESD detection signal $V_{RC}$, and the p+ rings and the n+ rings of the power clamp cell 610_1-610_4 are connected together, engineers will be more convenient and efficient in design.

Figure 7:
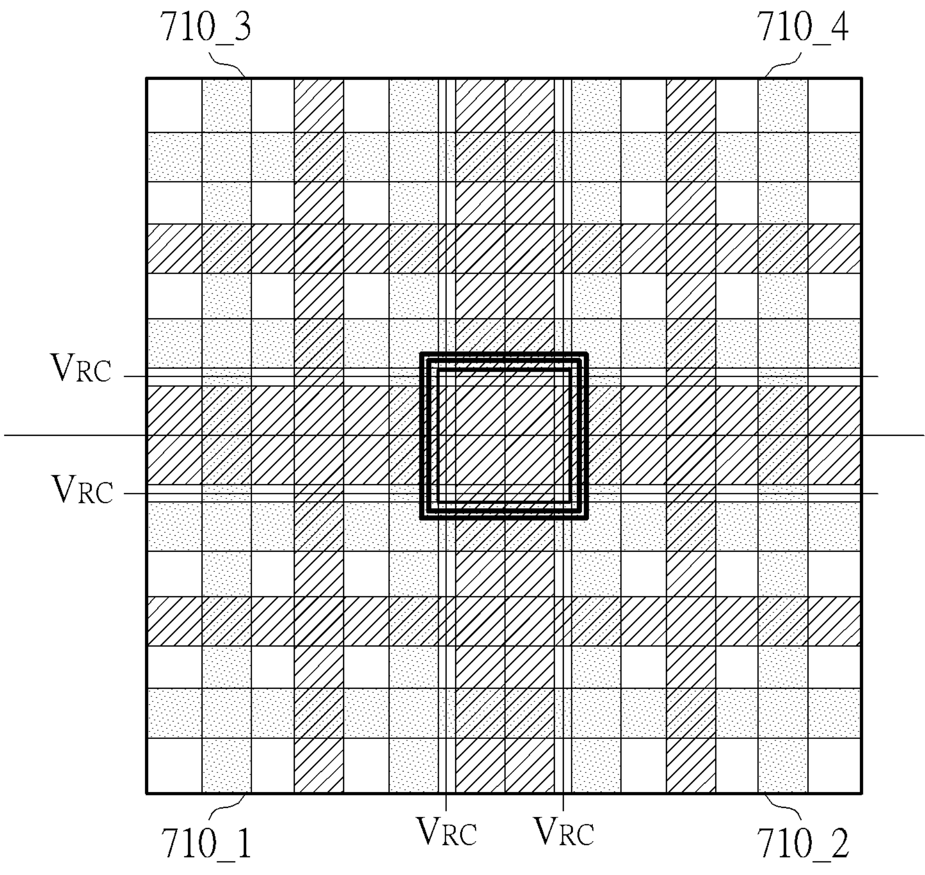
FIG. 7 is a diagram illustrating routings of a power clamp cell according to one embodiment of the present invention.
Figure 7:
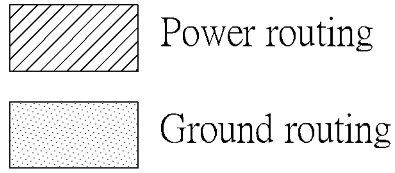

FIG. 7 is a diagram illustrating power clamp cell 710_1-710_4 according to one embodiment of the present invention. As shown in FIG. 7, the power clamp cell 710_1 comprises the power clamp cell 500/610_1 and the concept of the power clamp cell 100. Specifically, the power clamp cell 710_1 comprises two NMOS oxide OD positioned together, a PMOS OD positioned in a corner, such as an upper-right corner, of the power clamp cell 710_1. In this embodiment, the area corresponding to the PMOS OD is used to implement the PMOS MP1 shown in FIG. 4, and an N+ ring is manufactured around the PMOS OD; and the area corresponding to the NMOS OD is used to implement the NMOSs MN1 and MN2 shown in FIG. 4, and a P+ ring is manufactured between the NMOS OD and the N+ ring. The power clamp cell 710_1 further comprises a global bus comprising a vertical metal line and a horizontal metal line for the transmission of the ESD detection signal $V_{RC}$. In addition, the power clamp cell 710_1 further comprises a power routing and a ground routing, wherein the power routing has two directions and the ground routing also has two directions. In this embodiment, the power routing has two vertical metal lines and two horizontal metal lines, wherein the power routing is implemented by using a first metal layer in the semiconductor process, and the power routing is used to receive the supply voltage and provide the supply voltage to the semiconductor devices. The ground routing has two vertical metal lines and two horizontal metal lines, wherein the ground routing is implemented by using a second metal layer in the semiconductor process, the ground routing is used to receive the ground voltage and provide the ground voltage to the semiconductor devices, and there is at least one insulation layer manufactured between the first metal layer and the second metal layer.

The power clamp cell 710_2 is a vertical mirror of the power clam cell 710_1 (i.e., vertical line symmetry) or a result of rotating the power clam cell 710_1 with 90 degrees counterclockwise. The power clamp cell 710_3 is a horizontal mirror of the power clam cell 710_1 (i.e., horizontal line symmetry) or a result of rotating the power clam cell 710_1 with 90 degrees clockwise. The power clamp cell 710_4 is a result of rotating the power clam cell 710_1 with 180 degrees clockwise. Therefore, the designer can group multiple power clamp cells to generate the power clamp group shown in FIG. 7 with any suitable shape, so that the power clamp group fits the shape of the blank area of the chip layer, to add more components to the chip more efficiently.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power clamp cell, comprising:

a power clamping circuit;

a power routing in two directions, wherein the power routing has at least a first vertical metal line and a first horizontal metal line, and the power routing is implemented by using a first metal layer in semiconductor process; and a ground routing in two directions, wherein the ground routing has at least a second vertical metal line and a second horizontal metal line, and the ground routing is implemented by using a second metal layer in the semiconductor process;

wherein the power clamping circuit comprises:

a trigger circuit, configured to receive an electrostatic discharge (ESD) detection signal to generate a trigger signal, wherein the ESD detection signal is used to indicate if an ESD occurs; and a clamp device, coupled between a supply voltage and a ground voltage, configured to be enabled or disabled according to the trigger signal;

wherein the power clamp cell further comprises a global routing, wherein the global routing comprises a third vertical metal line and a third horizontal metal line for a transmission of the ESD detection signal.

2. A power clamp cell, comprising:

a power clamping circuit;

a power routing in two directions, wherein the power routing has at least a first vertical metal line and a first horizontal metal line, and the power routing is implemented by using a first metal layer in semiconductor process; and a ground routing in two directions, wherein the ground routing has at least a second vertical metal line and a second horizontal metal line, and the ground routing is implemented by using a second metal layer in the semiconductor process;

wherein the power clamping circuit comprises:

a trigger circuit, configured to receive an electrostatic discharge (ESD) detection signal to generate a trigger signal, wherein the ESD detection signal is used to indicate if an ESD occurs; and a clamp device, coupled between a supply voltage and a ground voltage, configured to be enabled or disabled according to the trigger signal;

wherein the trigger circuit comprises an inverter comprising a first P-type Metal Oxide Semiconductor (PMOS) and a first N-type Metal Oxide Semiconductor (NMOS), and the clamp circuit comprises a first NMOS; and the first PMOS is positioned in a corner of the power clamp circuit, and the first NMOS and the second NMOS are positioned in other three corners of the power clamp circuit.

3. A power clamp group, comprising:

a plurality of power clamp cells comprising at least a first power clamp cell, a second power clamp cell and a third power clamp cell, wherein the plurality of power clamp cells have the same circuit design, the first power clamp cell is immediately connected to the second power clamp cell in a vertical direction, and the first power clamp cell is immediately connected to the third power clamp cell in a horizontal direction;

wherein each power clamp cell comprises:

a power clamping circuit;

a power routing in two directions, wherein the power routing has at least a first vertical metal line and a first horizontal metal line, and the power routing is implemented by using a first metal layer in semiconductor process; and a ground routing in two directions, wherein the ground routing has at least a second vertical metal line and a second horizontal metal line, and the ground routing is implemented by using a second metal layer in the semiconductor process;

wherein the power clamping circuit comprises:

a trigger circuit, configured to receive an electrostatic discharge (ESD) detection signal to generate a trigger signal, wherein the ESD detection signal is used to indicate if an ESD occurs; and a clamp device, coupled between a supply voltage and a ground voltage, configured to be enabled or disabled according to the trigger signal;

wherein the power clamp cell further comprises a global routing, wherein the global routing comprises a third vertical metal line and a third horizontal metal line for a transmission of the ESD detection signal.

4. The power clamp cell of claim 3, wherein the global routings of the plurality of power clamp cells are connected together, so that the plurality of power clamp cells share the same ESD detection signal.

5. A power clamp group, comprising:

a plurality of power clamp cells comprising at least a first power clamp cell, a second power clamp cell and a third power clamp cell, wherein the plurality of power clamp cells have the same circuit design, the first power clamp cell is immediately connected to the second power clamp cell in a vertical direction, and the first power clamp cell is immediately connected to the third power clamp cell in a horizontal direction;

wherein each power clamp cell comprises:

a power clamping circuit;

a power routing in two directions, wherein the power routing has at least a first vertical metal line and a first horizontal metal line, and the power routing is implemented by using a first metal layer in semiconductor process; and a ground routing in two directions, wherein the ground routing has at least a second vertical metal line and a second horizontal metal line, and the ground routing is implemented by using a second metal layer in the semiconductor process;

wherein the power clamping circuit comprises:

a trigger circuit, configured to receive an electrostatic discharge (ESD) detection signal to generate a trigger signal, wherein the ESD detection signal is used to indicate if an ESD occurs; and a clamp device, coupled between a supply voltage and a ground voltage, configured to be enabled or disabled according to the trigger signal;

wherein the trigger circuit comprises an inverter comprising a first P-type Metal Oxide Semiconductor (PMOS) and a first N-type Metal Oxide Semiconductor (NMOS), and the clamp circuit comprises a first NMOS; and the first PMOS is positioned in a corner of the power clamp circuit, and the first NMOS and the second NMOS are positioned in other three corners of the power clamp circuit.

* * * * *